United States Patent
Shin

(10) Patent No.: US 10,418,080 B2
(45) Date of Patent: Sep. 17, 2019

(54) SEMICONDUCTOR MEMORY DEVICE

(71) Applicant: Samsung Electronics Co., Ltd., Suwon-si (KR)

(72) Inventor: Hyun-Jin Shin, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/014,486

(22) Filed: Jun. 21, 2018

(65) Prior Publication Data

US 2019/0122710 A1    Apr. 25, 2019

(30) Foreign Application Priority Data

Oct. 23, 2017   (KR) ........................ 10-2017-0137566

(51) Int. Cl.
| | |
|---|---|
| G11C 7/12 | (2006.01) |
| G11C 16/24 | (2006.01) |
| G11C 16/04 | (2006.01) |
| G11C 7/04 | (2006.01) |
| G11C 16/26 | (2006.01) |
| G11C 7/06 | (2006.01) |
| G11C 7/08 | (2006.01) |
| G11C 5/14 | (2006.01) |
| G11C 16/30 | (2006.01) |
| G11C 16/34 | (2006.01) |

(52) U.S. Cl.
CPC .............. *G11C 7/12* (2013.01); *G11C 5/145* (2013.01); *G11C 7/04* (2013.01); *G11C 7/062* (2013.01); *G11C 7/067* (2013.01); *G11C 7/08* (2013.01); *G11C 16/0425* (2013.01); *G11C 16/24* (2013.01); *G11C 16/26* (2013.01); *G11C 16/30* (2013.01); *G11C 16/3418* (2013.01)

(58) Field of Classification Search
CPC .... G11C 7/12; G11C 7/64; G11C 7/62; G11C 7/67
USPC ......................................... 365/211, 203, 202
See application file for complete search history.

(56) References Cited

U.S. PATENT DOCUMENTS

| | | | |
|---|---|---|---|
| 6,084,812 A | 7/2000 | Joo | |
| 7,257,028 B2 | 8/2007 | Lee et al. | |
| 7,495,961 B2 | 2/2009 | Cho et al. | |
| 7,760,549 B2 | 7/2010 | Isobe et al. | |
| 8,593,867 B2 | 11/2013 | Lee et al. | |
| 9,437,314 B2 | 9/2016 | Shin | |
| 9,478,261 B1 | 10/2016 | Lim et al. | |
| 2012/0081034 A1* | 4/2012 | Liao | H05B 33/0815 315/294 |

(Continued)

*Primary Examiner* — Han Yang
(74) *Attorney, Agent, or Firm* — Muir Patent Law, PLLC

(57) ABSTRACT

A semiconductor memory device includes a memory cell array including a plurality of memory cells connected to a plurality of bit lines, a control signal generating circuit configured to generate a first control signal in response to a first operating temperature of the semiconductor memory device and a second control signal in response to a second operating temperature of the semiconductor memory device, a precharge circuit configured to provide a precharge current to a first bit line of the plurality of bit lines in response to an enable signal, and a boost circuit configured to provide a boost current to the first bit line in response to the enable signal, wherein the magnitude of the boost circuit is responsive to one of the first and second control signals.

20 Claims, 8 Drawing Sheets

(56) References Cited

U.S. PATENT DOCUMENTS

2013/0223143 A1* 8/2013 Cho .................. G11C 16/0483
                                                    365/185.03
2017/0133096 A1   5/2017 Yoo et al.

* cited by examiner

SEMICONDUCTOR MEMORY DEVICE

This application claims the benefit of Korean Patent Application No. 10-2017-0137566, filed on Oct. 23, 2017, in the Korean Intellectual Property Office, the disclosure of which is incorporated herein in its entirety by reference.

BACKGROUND

1. Field

The present disclosure relates to a semiconductor memory device.

2. Description of the Related Art

To sense an on/off memory cell in a nonvolatile memory device, an on current flowing through a bit line of a memory cell array may be used. The bit line of the memory cell array may be precharged to allow the on current to flow through the bit line. For accurate on/off memory cell sensing, the bit line of the memory cell array may be precharged to a certain level.

When an operating temperature of the semiconductor memory device is high, the precharge time may be long due to a leakage current or the like. Therefore, when the operating temperature of the semiconductor memory device is high, a relatively large precharge current may be required. On the other hand, when the operating temperature of the semiconductor memory device is low, if the bit line is precharged using a relatively large precharge current as in the case where the operating temperature of the semiconductor memory device is high, it may be over-precharged. As a result, the operating speed of the bit line may be reduced.

SUMMARY

Aspects of the inventive concept provide a semiconductor memory device which can reduce a precharge time by precharging a bit line of a memory cell array using a current according to an operating temperature.

However, aspects of the inventive concept are not restricted to the one set forth herein. The above and other aspects of the inventive concept will become more apparent to one of ordinary skill in the art to which the inventive concept pertains by referencing the detailed description of the inventive concept given below.

According to some embodiments of the inventive concept, there is provided a semiconductor memory device comprising, a memory cell array including a plurality of memory cells connected to a plurality of bit lines, a control signal generating circuit configured to generate a first control signal in response to a first operating temperature of the semiconductor memory device and a second control signal in response to a second operating temperature of the semiconductor memory device, a precharge circuit configured to provide a precharge current to a first bit line of the plurality of bit lines in response to an enable signal, and a boost circuit configured to provide a boost current to the first bit line in response to the enable signal, wherein magnitude of the boost circuit is responsive to one of the first and second control signals.

According to some embodiments of the inventive concept, there is provided a semiconductor memory device comprising a memory cell array including a plurality of memory cells connected to a plurality of bit lines, a control signal generating circuit which generates a first control signal having a value responsive to a first operating temperature and generates a second control signal having a value responsive to a second operating temperature, and a boost circuit connected to a voltage source and is controlled by any one of the first control signal and the second control signal. The control signal generating circuit is configured to generate a first control current in response to the first operating temperature and to generate a second control current in response to the second operating temperature. The boost circuit provides a first boost current having the same magnitude as the first control current to a first bit line of the plurality of bit lines when the boost circuit is controlled by the first control signal and provides a second boost current having the same magnitude as the second control current to the first bit line when the boost circuit is controlled by the second control signal.

According to some embodiments of the inventive concept, there is provided a semiconductor memory device comprising a memory cell array including a plurality of memory cells connected to a plurality of bit lines, a control signal generating circuit configured to generate a first control signal in response to a first operating temperature of the semiconductor memory device and a second control signal in response to a second operating temperature of the semiconductor memory device, and a sensing circuit configured to generate a precharge current in response to an enable signal, to generate a boost current in response to the enable signal and one of the first and second control signals, and to provide the precharge current and the boost current to a first bit line of the plurality of bit lines.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

It will be understood that, although the terms first, second, third etc. may be used herein to describe various elements, these elements should not be limited by these terms. Unless indicated otherwise, these terms are generally used to distinguish one element from another. Thus, a first element discussed below in one section of the specification could be termed a second element in a different section of the specification without departing from the teachings of the present disclosure. Also, terms such as "first" and "second" may be used in the claims to name an element of the claim, even thought that particular name is not used to describe in connection with the element in the specification.

Figure 1:
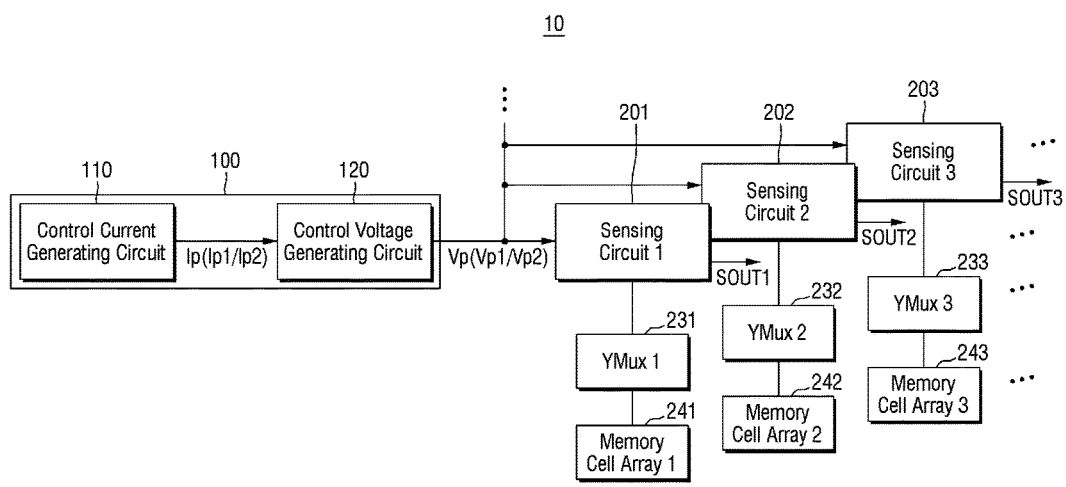
FIG. 1 is a block diagram of a semiconductor memory device according to example embodiments.

FIG. 1 is a block diagram of a semiconductor memory device 10 according to example embodiments.

Referring to FIG. 1, the semiconductor memory device 10 may include a control signal generating circuit 100, a first sensing circuit 201, a second sensing circuit 202, a third sensing circuit 203, a first multiplexer 231, a second multiplexer 232, a third multiplexer 233, a first memory cell array 241, a second memory cell array 242, and a third memory cell array 243.

The control signal generating circuit 100 may include a control current generating circuit 110 and a control voltage generating circuit 120.

The control current generating circuit 110 may generate a current proportional or inversely proportional to an operating temperature of the semiconductor memory device 10. In some embodiments, when the control current generating circuit 110 generates a current proportional to the operating temperature, the magnitude of an output current of the control current generating circuit 110 may increase as the operating temperature increases. For example, the control current generating circuit 110 may generate a control current Ip at an operating temperature of the semiconductor memory device 10. For example, the control current generating circuit 110 may generate a first control current Ip1 at a first operating temperature and generate a second control current Ip2 at a second operating temperature.

The control voltage generating circuit 120 may generate a control voltage Vp according to the output current (i.e., the control current Ip) of the control current generating circuit 110.

For example, when receiving the first control current Ip1 from the control current generating circuit 110, the control voltage generating circuit 120 may generate a first control voltage Vp1 corresponding to the first control current Ip1. In addition, when receiving the second control current Ip2 from the control current generating circuit 110, the control voltage generating circuit 120 may generate a second control voltage Vp2 corresponding to the second control current Ip2. In other words, the first control voltage Vp1 and the second control voltage Vp2 output from the control voltage generating circuit 120 may be generated in response to the first control current Ip1 and the second control current Ip2, respectively.

The control voltage generating circuit 120 may generate a voltage proportional or inversely proportional to the magnitude of the output current (i.e., the first control current Ip1 or the second control current Ip2) of the control current generating circuit 110. In some embodiments, when the control voltage generating circuit 120 generates a voltage proportional to the magnitude of the output current (i.e., the first control current Ip1 or the second control current Ip2) of the control current generating circuit 110, the magnitude of the output voltage of the control voltage generating circuit 120 may increase as the operating temperature increases.

Any one of the first control voltage Vp1 and the second control voltage Vp2 may be provided to each of the first sensing circuit 201, the second sensing circuit 202 and the third sensing circuit 203.

The first sensing circuit 201, the second sensing circuit 202 and the third sensing circuit 203 may be connected to the first multiplexer 231, the second multiplexer 232 and the third multiplexer 233, respectively.

The first multiplexer 231, the second multiplexer 232 and the third multiplexer 233 may be connected to the first memory cell array 241, the second memory cell array 242 and the third memory cell array 243, respectively.

The first multiplexer 231 may select one of a plurality of bit lines of the first memory cell array 241, and connect the selected bit line to the first sensing circuit 201. The second multiplexer 232 may select one of a plurality of bit lines of the second memory cell array 242, and connect the selected bit line to the second sensing circuit 202. The third multiplexer 233 may select one of a plurality of bit lines of the third memory cell array 243, and connect the selected bit line to the third sensing circuit 203.

The first sensing circuit 201 may receive any one of the first control voltage Vp1 and the second control voltage Vp2 and generate a first current I1 (see FIG. 2) that precharges a first bit line of the first memory cell array 241 selected by the first multiplexer 231. The second sensing circuit 202 may receive any one of the first control voltage Vp1 and the second control voltage Vp2 and generate a second current that precharges a second bit line of the second memory cell array 242 selected by the second multiplexer 232. The third sensing circuit 203 may receive any one of the first control voltage Vp1 and the second control voltage Vp2 and generate a third current that precharges a third bit line of the third memory cell array 243 selected by the third multiplexer 233. The precharge operation of a sensing circuit will be described in detail later.

One of a first output SOUT1 of the first sensing circuit 201, a second output SOUT2 of the second sensing circuit 202 and a third output SOUT3 of the third sensing circuit 203 may be provided to an output circuit (not shown). The output circuit may output a data signal detected by the sensing circuit to an outside of the semiconductor memory device 10. For example, the first output SOUT1 of the first sensing circuit 201, the second output SOUT2 of the second sensing circuit 202 and the third output SOUT3 of the third sensing circuit 203 may be used to sense on/off state of memory cells of the first memory cell array 241, the second memory cell array 242 and the third memory cell array 243, respectively.

Although three sensing circuits 201 through 203, three multiplexers 231 through 233 and three memory cell arrays 241 through 243 are illustrated in FIG. 1, the technical spirit of the inventive concept is not limited to this case. For example, the semiconductor memory device 10 according to example embodiments may include fewer or more than three sensing circuits, multiplexers, and memory cell arrays.

In FIG. 1, only a multiplexer and a sensing circuit are illustrated as elements connected to a memory cell array. However, this is only for clarity of illustration, and the technical spirit of the inventive concept is not limited to this case. For example, a column decoder, a row decoder, etc. may further be connected to the memory cell array.

In some embodiments, the semiconductor memory device 10 may be a flash memory device.

In some embodiments, the semiconductor memory device 10 may be one of a dynamic random access memory (DRAM), a static random access memory (SRAM), a mobile DRAM, a phase random access memory (PRAM), a ferroelectric random access memory (FRAM), a resistive random access memory (RRAM), a magnetic random access memory (MRAM), etc.

Figure 2:
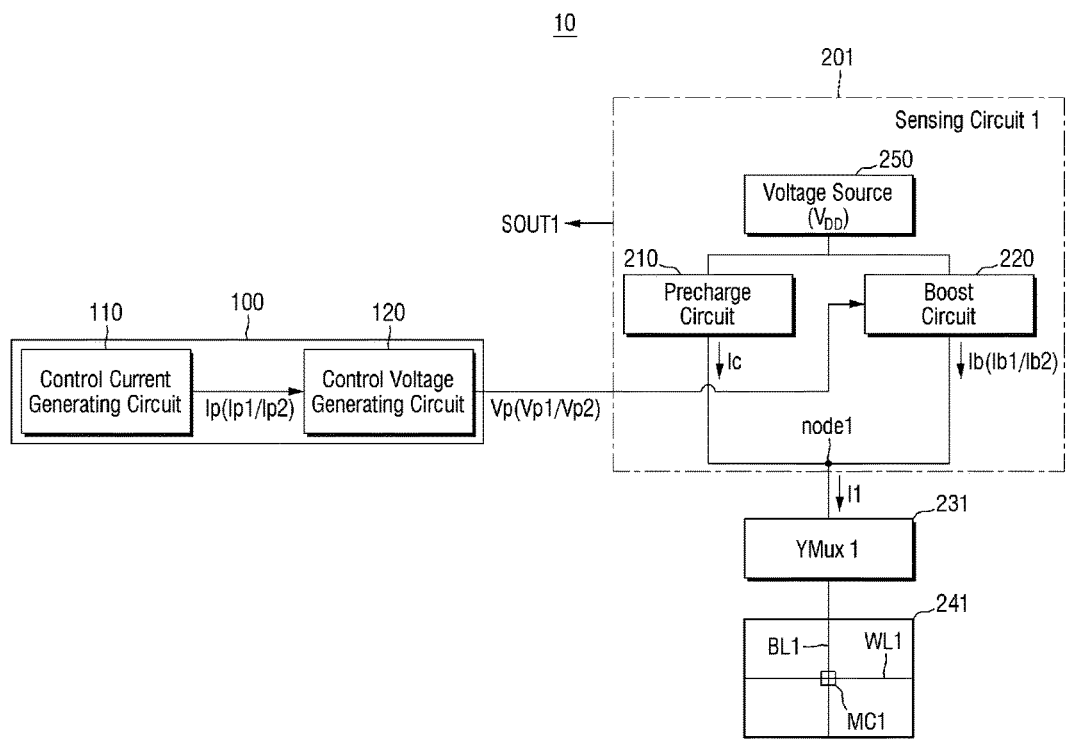
FIG. 2 is a block diagram of the semiconductor memory device of FIG. 1 according to example embodiments.

FIG. 2 is a block diagram of the semiconductor memory device of FIG. 1 according to example embodiments. In FIG. 2, the second sensing circuit 202, the third sensing circuit 203, the second multiplexer 232, the third multiplexer 233, the second memory cell array 242 and the third memory cell array 243 of FIG. 1 are omitted for clarity of illustration.

Figure 3:
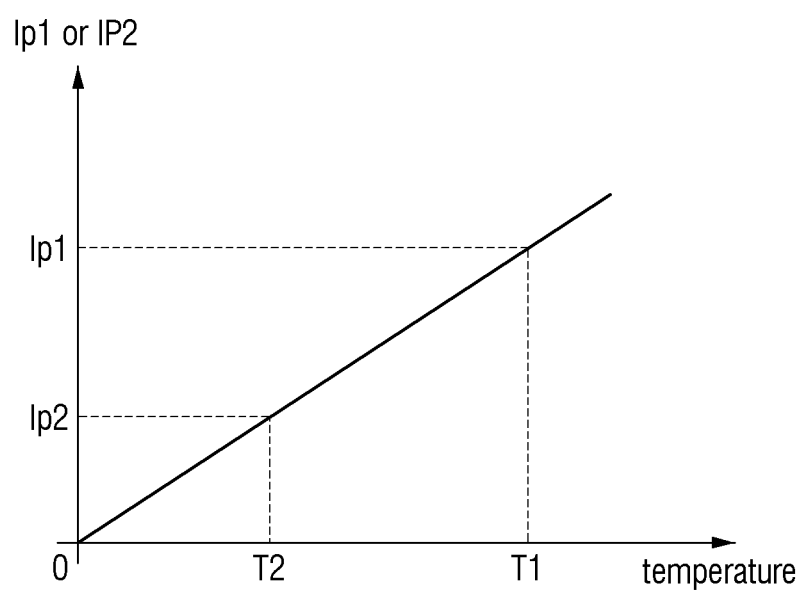
FIG. 3 is a graph for explaining a control current generating circuit of FIG. 2 according to example embodiments.

FIG. 3 is a graph for explaining the control current generating circuit 110 of FIG. 2 according to example embodiments. In the graph of FIG. 3, the x-axis represents temperature (e.g., absolute temperature), and the y-axis represents the magnitude of the output current (e.g., the first control current Ip1 or the second control current Ip2) of the control current generating circuit 110.

The first sensing circuit 201, the first multiplexer 231, and the first memory cell array 241 of FIG. 1 will now be described. For example, the second sensing circuit 202 and the third sensing circuit 203 may be the same as the first sensing circuit 201, the second multiplexer 232 and the third multiplexer 233 may be the same as the first multiplexer 231, and the second memory cell array 242 and the third memory cell array 243 may be the same as the first memory cell array 241. For clarity, a redundant description of elements and features identical to those described above will be omitted.

Referring to FIGS. 2 and 3, the first memory cell array 241 of the semiconductor memory device 10 may include a plurality of bit lines and a plurality of word lines.

The bit lines may include a first bit line BL1. The word lines may include a first word line WL1. A first memory cell MC1 may be connected to the first bit line BL1 and the first word line WL1.

The first bit line BL1 may be any one of the bit lines which is selected by the first multiplexer 231. The first current I1 may be used to precharge the first bit line BL1. For example, the first current I1 may be used to precharge the first bit line BL1 during a read operation of the semiconductor memory device 10. The first current I1 will be described in more detail later.

The control current generating circuit 110 may generate a control current (the first control current Ip1 or the second control current Ip2) according to the temperature (e.g., the absolute temperature). For example, the control current generating circuit 110 may generate the first control current Ip1 at a first operating temperature T1 and generate the second control current Ip2 at a second operating temperature T2.

Here, the temperature may be, for example, the operating temperature of the semiconductor memory device 10. However, the technical spirit of the inventive concept is not limited to this case. For example, the temperature may be the temperature of a particular part of the semiconductor memory device 10 or the temperature outside the semiconductor memory device 10.

The first operating temperature T1 may be higher than the second operating temperature T2. In some embodiments, when the control current generating circuit 110 generates a current proportional to the operating temperature, the magnitude of the first control current Ip1 may be greater than the magnitude of the second control current Ip2.

In some embodiments, unlike in the graph of FIG. 3, each of the first operating temperature T1 and the second operating temperature T2 may refer to a certain temperature range. For example, the second operating temperature T2 may range from a first temperature a1 to a second temperature a2, and the first operating temperature T1 may range from a third temperature a3 to a fourth temperature a4. Here, the second temperature a2 may be higher than the first temperature a1, the third temperature a3 may be higher than the second temperature a2, and the fourth temperature a4 may be higher than the third temperature a3.

When each of the first operating temperature T1 and the second operating temperature T2 refers to a certain temperature range, the first control current Ip1 generated by the control current generating circuit 110 at the first operating temperature T1 (i.e., in a certain temperature range) may be a preset value. In addition, when the control current generating circuit 110 generates a current proportional to the operating temperature, the second control current Ip2 generated by the control current generating circuit 110 at the second operating temperature T2 (i.e., in a certain temperature range not overlapping the first operating temperature T1) may be a preset value smaller than the magnitude of the first control current Ip1. For example, when each of the first control current Ip1 and the second control current Ip2 is a preset value, the magnitude of each of the first control current Ip1 and the second control current Ip2 may be set to a magnitude large enough to compensate for a leakage current of a bit line (e.g., the first bit line BL1) to be precharged.

The control voltage generating circuit 120 may generate the control voltage Vp. For example, the control voltage generating circuit 120 may generate the first control voltage Vp1 in response to the first control current Ip1 at the first operating temperature T1. In addition, the control voltage generating circuit 120 may generate the second control voltage Vp2 in response to the second control current Ip2 at the second operating temperature T2.

Any one of the first control voltage Vp1 and the second control voltage Vp2 may be provided to the first sensing circuit 201.

The first sensing circuit 201 may include a voltage source 250 (e.g., external power supply $V_{DD}$ or internal power voltage Vint), a precharge circuit 210, and a boost circuit 220.

The precharge circuit 210 may receive the voltage source 250 and generate a precharge current Ic. The precharge circuit 210 may provide the generated precharge current Ic to a first node node1.

The first node node1 may be connected to the first memory cell array 241 by the first multiplexer 231. For example, the first node node1 may be electrically connected to a bit line of the first memory cell array 241. When the first multiplexer 231 selects any one (e.g., the first bit line BL1) of a plurality of bit lines of the first memory cell array 241, the first node node1 may be connected to the selected bit line (e.g., the first bit line BL1).

The boost circuit 220 may be controlled by the control voltage Vp. For example, the boost circuit 220 may be controlled by any one of the first control voltage Vp1 and the second control voltage Vp2.

When controlled by the first control voltage Vp1, the boost circuit 220 may receive the voltage source 250 and generate a first boost current Ib1. The magnitude of the first boost current Ib1 may be equal to the magnitude of the first control current Ip1. The boost circuit 220 may provide the first boost current Ib1 to the first node node1. For example, at the first operating temperature T1, the first current I1 may be the sum of the precharge current Ic and the first boost current Ib1.

When controlled by the second control voltage Vp2, the boost circuit 220 may receive the voltage source 250 and generate a second boost current Ib2. The magnitude of the second boost current Ib2 may be equal to the magnitude of the second control current Ip2. The boost circuit 220 may provide the second boost current Ib2 to the first node node1.

For example, at the second operating temperature T2, the first current I1 may be the sum of the precharge current Ic and the second boost current Ib2.

The first current I1 may be provided to the first bit line BL1 selected by the first multiplexer 231 to precharge the first bit line BL1. In other words, the first bit line BL1 of the first memory cell array 241 may be precharged with the precharge current Ic and the first boost current Ib1 at the first operating temperature T1 and may be precharged with the precharge current Ic and the second boost current Ib2 at the second operating temperature T2.

Figure 4:
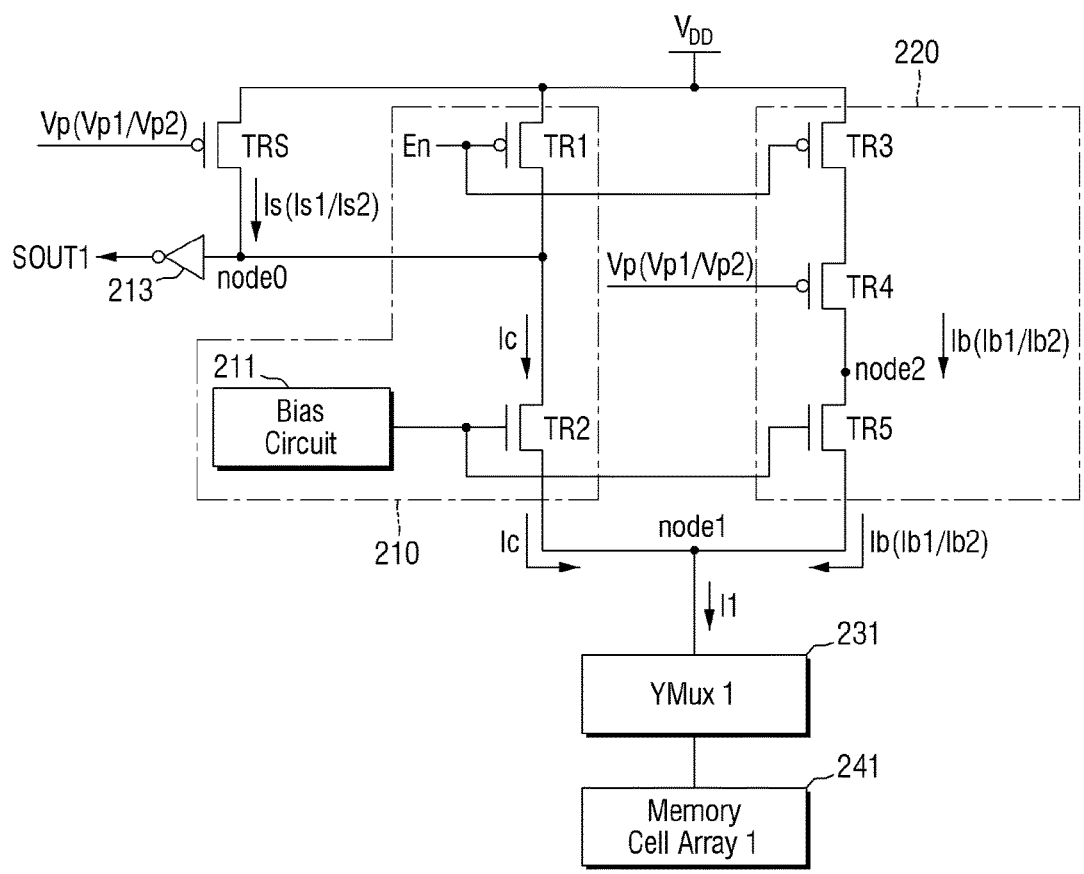
FIG. 4 illustrates a sensing circuit 201 of FIG. 2 according to example embodiments.

FIG. 4 illustrates the sensing circuit 201 of FIG. 2 according to example embodiments. For clarity, a redundant description of elements and features identical to those described above will be omitted.

The sensing circuit 201 may include the precharge circuit 210 and the boost circuit 220. The precharge circuit 210 may include a bias circuit 211, a first transistor TR1, and a second transistor TR2. The first transistor TR1 and the second transistor TR2 may be connected in series between the voltage source $V_{DD}$ and the first node node1.

In FIG. 4, the bias circuit 211 is included in the precharge circuit 210. However, the technical spirit of the inventive concept is not limited to this case. For example, the bias circuit 211 may be disposed separately from the first sensing circuit 201.

The first transistor TR1 may be, for example, a P-channel metal oxide semiconductor (PMOS) transistor, and the second transistor TR2 may be, for example, an N-channel metal oxide semiconductor (NMOS) transistor. The first transistor TR1 may be switched on when an enable signal En is at a logic low. For example, the enable signal En may have a low pulse signal or a high pulse signal during a precharge time period for a read operation.

The first transistor TR1 may be gated by, e.g., the enable signal En and may have a terminal connected to the voltage source $V_{DD}$.

For example, a terminal of the second transistor TR2 may be connected to the other terminal of the first transistor TR1, and the other terminal of the second transistor TR2 may be connected to the first node node1. The second transistor TR2 may be gated by an output signal of the bias circuit 211.

In some embodiments, when the first transistor TR1 is gated by the enable signal En, the precharge circuit 210 may provide the precharge current Ic to the first node node1. For example, when the first transistor TR1 is gated by the enable signal En, the precharge current Ic may pass through the second transistor TR2 which is gated by the output signal of the bias circuit 211.

The boost circuit 220 may be connected in parallel to the precharge circuit 210 and may be disposed between the voltage source $V_{DD}$ and the first node node1. The boost circuit 220 may include a third transistor TR3, a fourth transistor TR4, and a fifth transistor TR5. The third transistor TR3, the fourth transistor TR4 and the fifth transistor TR5 may be connected in series between the voltage source $V_{DD}$ and the first node node1.

Each of the third transistor TR3 and the fourth transistor TR4 may be, e.g., a PMOS transistor, and the fifth transistor TR5 may be, e.g., an NMOS transistor.

The third transistor TR3 may be gated by, e.g., the enable signal En and may have a terminal connected to the voltage source $V_{DD}$.

For example, a terminal of the fourth transistor TR4 may be connected to the other terminal of the third transistor TR3, and the other terminal of the fourth transistor TR4 may be connected to a second node node2.

For example, a terminal of the fifth transistor TR5 may be connected to the second node node2, and the other terminal of the fifth transistor TR5 may be connected to the first node node1. A gate of the fifth transistor TR5 and a gate of the second transistor TR2 may be connected to each other. In other words, the fifth transistor TR5 may be gated by the output signal of the bias circuit 211.

At least one of the third transistor TR3, the fourth transistor TR4 and the fifth transistor TR5 may be gated by any one of the first control voltage Vp1 and the second control voltage Vp2. In some embodiments, the fourth transistor TR4 among the third transistor TR3, the fourth transistor TR4 and the fifth transistor TR5 may be gated by any one of the first control voltage Vp1 and the second control voltage Vp2.

In some embodiments, when the fourth transistor TR4 is gated by the first control voltage Vp1, the boost circuit 220 may provide the first boost current Ib1 to the first node node1. For example, when the fourth transistor TR4 is gated by the first control voltage Vp1, the first boost current Ib1 may pass through the fourth transistor TR4. In other words, when the fourth transistor TR4 is gated by the first control voltage Vp1, a current (e.g., the first boost current Ib1) having the same magnitude as the first control current Ip1 corresponding to the first operating temperature T1 may flow through the second node node2. When the fourth transistor TR4 is gated by the first control voltage Vp1, the boost circuit 220 may be controlled by the first control voltage Vp1.

When the fourth transistor TR4 is gated by the second control voltage Vp2, the boost circuit 220 may provide the second boost current Ib2 to the first node node1. For example, when the fourth transistor TR4 is gated by the second control voltage Vp2, the second boost current Ib2 may pass through the fourth transistor TR4. In other words, when the fourth transistor TR4 is gated by the second control voltage Vp2, a current (e.g., the second boost current Ib2) having the same magnitude as the second control current Ip2 may flow through the second node node2. When the fourth transistor TR4 is gated by the second control voltage Vp2, the boost circuit 220 may be controlled by the second control voltage Vp2.

In some embodiments, the first sensing circuit 201 may further include a sensing transistor TRS disposed between the voltage source $V_{DD}$ and an output node node0.

In some embodiments, the sensing transistor TRS may be gated by the control voltage Vp. For example, a terminal of the sensing transistor TRS may be connected to the voltage source $V_{DD}$, and the other terminal of the sensing transistor TRS may be connected to the output node node0. The sensing transistor TRS may be gated by any one of the first control voltage Vp1 and the second control voltage Vp2. The other terminal of the sensing transistor TRS and the other terminal of the first transistor TR1 may be connected to the output node node0.

As an example, a current flowing through the output node node0 may be output as the first output SOUT1 via an inverter 213. As another example, the sensing current Is may be provided to the first node node1 and may be compensated to a leakage current of an off state memory cell of the first memory cell array 241 during a sensing period after a precharge period is completed.

When the sensing transistor TRS is gated by the control voltage Vp, a sensing current Is may be provided to the output node node0. For example, when the sensing transistor TRS is gated by the first control voltage Vp1, for example, at the first operating temperature T1, a first sensing current Is1 may be provided to the output node node0. The magnitude of the first sensing current Is1 may be equal to the magnitude of the first control current Ip1.

When the sensing transistor TRS is gated by the second control voltage Vp2, for example, at the second operating temperature T2, a second sensing current Is2 may be provided to the output node node0. The magnitude of the second sensing current Is2 may be equal to the magnitude of the second control current Ip2.

When the enable signal En is at a logic high, the first transistor TR1 may be switched off. In other words, a period during which the enable signal En is at a logic low may be the precharge period for precharging a bit line, and a period during which the enable signal En is at a logic high after the precharge period may be the sensing period for sensing on/off cells of a memory cell array.

In the sensing period after precharge is completed, a precharge level of a bit line of an off cell may be reduced by a leakage current or the like. In this case, the precharge level of the bit line of the off cell may be compensated using a current (e.g., the first sensing current Is1 or the second sensing current Is2) flowing through the sensing transistor TRS according to the operating temperature.

Figure 5:
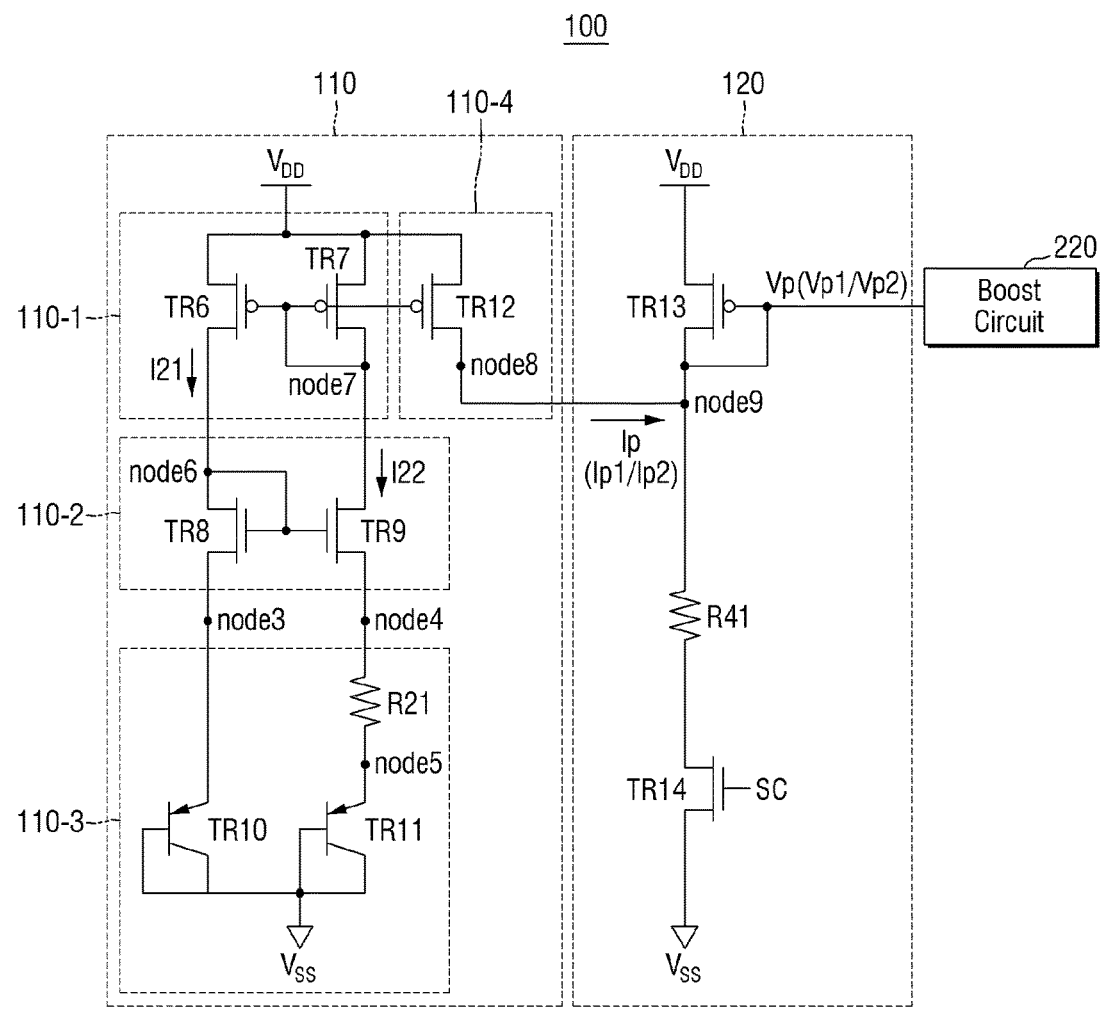
FIG. 5 illustrates the control current generating circuit and a control voltage generating circuit of FIGS. 1 and 2 according to example embodiments.

FIG. 5 illustrates the control current generating circuit 110 and the control voltage generating circuit 120 of FIGS. 1 and 2 according to example embodiments. For clarity, a redundant description of elements and features identical to those described above will be omitted.

Referring to FIG. 5, the control current generating circuit 110 may include a first current mirror unit 110-1, a second current mirror unit 110-2, a level control unit 110-3, and an output unit 110-4.

The first current mirror unit 110-1 and the second current mirror unit 110-2 may be connected between the voltage source $V_{DD}$ and a third node node3 and between the voltage source $V_{DD}$ and a fourth node node4. The first current mirror unit 110-1 and the second current mirror unit 110-2 may mirror a first sub-current I21 flowing through the third node node3 and a second sub-current I22 flowing through the fourth node node4.

The first current mirror unit 110-1 may be disposed between the voltage source $V_{DD}$ and a sixth node node6 and between the voltage source $V_{DD}$ and a seventh node node7. The first current mirror unit 110-1 may include a sixth transistor TR6 and a seventh transistor TR7. Each of the sixth transistor TR6 and the seventh transistor TR7 may be, for example, a PMOS transistor.

A terminal of the sixth transistor TR6 may be connected to the voltage source $V_{DD}$, and the other terminal of the sixth transistor TR6 may be connected to the sixth node node6. A terminal of the seventh transistor TR7 may be connected to the voltage source $V_{DD}$, and the other terminal of the seventh transistor TR7 may be connected to the seventh node node7. A gate of the sixth transistor TR6 and a gate of the seventh transistor TR7 may be connected to each other. The gate of the sixth transistor TR6 and the gate of the seventh transistor TR7 connected to each other may be connected to the seventh node node7.

The second current mirror unit 110-2 may be disposed between the third node node3 and the sixth node node6 and between the fourth node node4 and the seventh node node7. The second current mirror unit 110-2 may include an eighth transistor TR8 and a ninth transistor TR9. Each of the eighth transistor TR8 and the ninth transistor TR9 may be, for example, an NMOS transistor.

A terminal of the eighth transistor TR8 may be connected to the sixth node node6, and the other terminal of the eighth transistor TR8 may be connected to the third node node3. A terminal of the ninth transistor TR9 may be connected to the seventh node node7, and the other terminal of the ninth transistor TR9 may be connected to the fourth node node4. A gate of the eighth transistor TR8 and a gate of the ninth transistor TR9 may be connected to each other. The gate of the eighth transistor TR8 and the gate of the ninth transistor TR9 connected to each other may be connected to the sixth node node6.

The level control unit 110-3 may be disposed between the third node node 3 and a ground $V_{SS}$ and between the fourth node node4 and the ground $V_{SS}$. The level control unit 110-3 may include a first resistor R21, a tenth transistor TR10 and an eleventh transistor TR11. Each of the tenth transistor TR10 and the eleventh transistor TR11 may be, for example, a bipolar junction transistor (BJT).

A terminal of the tenth transistor TR10 may be connected to the third node node3, and the other terminal of the tenth transistor TR10 may be connected to the ground $V_{SS}$. When the tenth transistor TR10 is a BJT, an emitter which is a terminal of the tenth transistor TR10 may be connected to the third node node3, and a base and a collector which is the other terminal of the tenth transistor TR10 may be connected to the ground $V_{SS}$.

A terminal of the eleventh transistor TR11 may be connected to the fifth node node5, and the other terminal of the eleventh transistor TR11 may be connected to the ground $V_{SS}$. When the eleventh transistor TR11 is a BJT, an emitter which is a terminal of the eleventh transistor TR11 may be connected to the fifth node node5, and a base and a collector may be connected to the ground $V_{SS}$.

The level control unit 110-3 may control the levels of the first sub-current I21 and the second sub-current I22, which are output from the first current or unit 110-1 and the second current mirror unit 110-2, based on the voltage levels of the third node node3 and the fourth node node4, respectively.

A terminal of the first resistor R21 may be connected to the fourth node node4, and the other terminal of the first resistor R21 may be connected to the fifth node node5. Therefore, the first resistor R21 may form a current path between the fourth node node4 and the fifth node node5.

The first resistor R21 may be, for example, a variable resistor having a resistance value proportional or inversely proportional to the operating temperature. The resistance value of the first resistor R21 may change according to the operating temperature, thereby changing the output of the control current generating circuit 110.

In some embodiments, the resistance value of the first resistor R21 may be inversely proportional to the operating temperature. The case where the resistance value of the first resistor R21 is inversely proportional to the operating temperature will hereinafter be described. As the temperature increases, the resistance value of the first resistor R21 may be reduced. Accordingly, the magnitude of the second sub-current I22 and the magnitude of the first sub-current I21, which is a mirrored current of the second sub-current I22, may increase. The magnitude of the output current (e.g., the first control current Ip1 or the second control current Ip2) of the control current generating circuit 110 may be inversely proportional to the magnitude of the first resistor R21.

When the magnitude of the first control current Ip1 is greater than the magnitude of the second control current Ip2, the magnitude of the first resistor R21 may decrease as the temperature increases. Therefore, the output current of the control current generating circuit 110 may be the first control current Ip1. In addition, the magnitude of the first resistor R21 may increase as the temperature decreases. Therefore, the output current of the control current generating circuit 110 may be the second control current Ip2.

Although the case where the first resistor R21 is a variable resistor has been described above, the technical spirit of the inventive concept is not limited to this case. For example, the first resistor R21 may be a MOS transistor gated by a bias voltage and having a terminal connected to the fourth node node4 and the other terminal connected to the fifth node node5. In this case, the first resistor R21, which is a MOS transistor, may have a temperature coefficient proportional or inversely proportional to the temperature. Thus, the first resistor R21 may have a resistance value proportional or inversely proportional to the temperature. For example, the first resistor R21 may be configured to control the level of the second sub-current I22 according to the temperature.

The output unit 110-4 may include a twelfth transistor TR12. A terminal of the twelfth transistor TR12 may be connected to the voltage source $V_{DD}$, and the other terminal of the twelfth transistor TR12 may be connected to an eighth node node8. The twelfth transistor TR12 may be gated by the voltage of the seventh node node7.

The output unit 110-4 may output the first sub-current I21 or the second sub-current I22 which is a current mirrored by the first current mirror unit 110-1 and the second current mirror unit 110-2 as the control current Ip. The output unit 110-4 may form a current path between the voltage source $V_{DD}$ and the eighth node node8 to control the level of the output current the first control current Ip1 or the second control current Ip2) of the control current generating circuit 110.

The control voltage generating circuit 120 may include a thirteenth transistor TR13, a second resistor R41, and a fourteenth transistor TR14.

A terminal of the thirteenth transistor TR13 may be connected to the voltage source $V_{DD}$, and the other terminal of the thirteenth transistor TR13 may be connected to a ninth node node9. A gate of the thirteenth transistor TR13 may be connected to the ninth node node9. The output current (e.g., the first control current Ip1 or the second control current Ip2) of the control current generating circuit 110 may be supplied to the ninth node node9.

A terminal of the second resistor R41 may be connected to the ninth node node9.

A terminal of the fourteenth transistor TR14 may be connected to the other terminal of the second resistor R41, and the other terminal of the fourteenth transistor TR14 may be connected to the ground $V_{SS}$. The fourteenth transistor TR14 may be gated by a control signal SC. The fourteenth transistor TR14 may enable the control voltage generating circuit 120 in response to the control signal SC.

Equation 1 below may be obtained by applying Kirchhoff's current law at the ninth node node9.

$$Ip + \{\beta(V_{DD} - Vp + Vth)^2\}/2 - Vp/R41 = 0 \quad (1).$$

In addition, when the magnitude of the first resistor R21 is inversely proportional to the temperature, Equation 2 below may be established for the output current (e.g., the first control current Ip1 or the second control current Ip2) of the control current generating circuit 110.

$$Ip \propto KT/R21 \quad (2).$$

Here, Ip may be any one of the first control current Ip1 and the second control current Ip2, and Vp may be any one of the first control voltage Vp1 and the second control voltage Vp2. In addition, β may be a characteristic constant of the thirteenth transistor TR13, Vth may be a threshold voltage of the thirteenth transistor TR13, K may be a proportional constant, and T may be temperature.

As apparent from Equations 1 and 2, Ip increases as the temperature increases, and Vp increases as Ip increases. In addition, Ip decreases as the resistance value of the first resistor R21 increases, and Vp decreases as Ip decreases.

For example, at the first operating temperature T1, the output current of the control current generating circuit 110 may be the first control current Ip1, and the output voltage of the control voltage generating circuit 120 may be the first control voltage Vp1. In addition, at the second operating temperature T2 lower than the first operating temperature T1, the output current of the control current generating circuit 110 may be the second control current Ip2, and the output voltage of the control voltage generating circuit 120 may be the second control voltage Vp2. The magnitude of the first control current Ip1 may be greater than the magnitude of the second control current Ip2, and the magnitude of the first control voltage Vp1 may be greater than the magnitude of the second control voltage Vp2.

In the semiconductor memory device 10 according to example embodiments, if the resistance value of the first resistor R21 is inversely proportional to the temperature, when the temperature increases to increase Ip, the resistance value of the first resistor R21 decreases. Therefore, a delay that may occur during precharging can be reduced.

The output voltage (e.g., the first control voltage Vp1 or the second control voltage Vp2) of the control voltage generating circuit 120 may be provided to the boost circuit 220.

Figure 6:
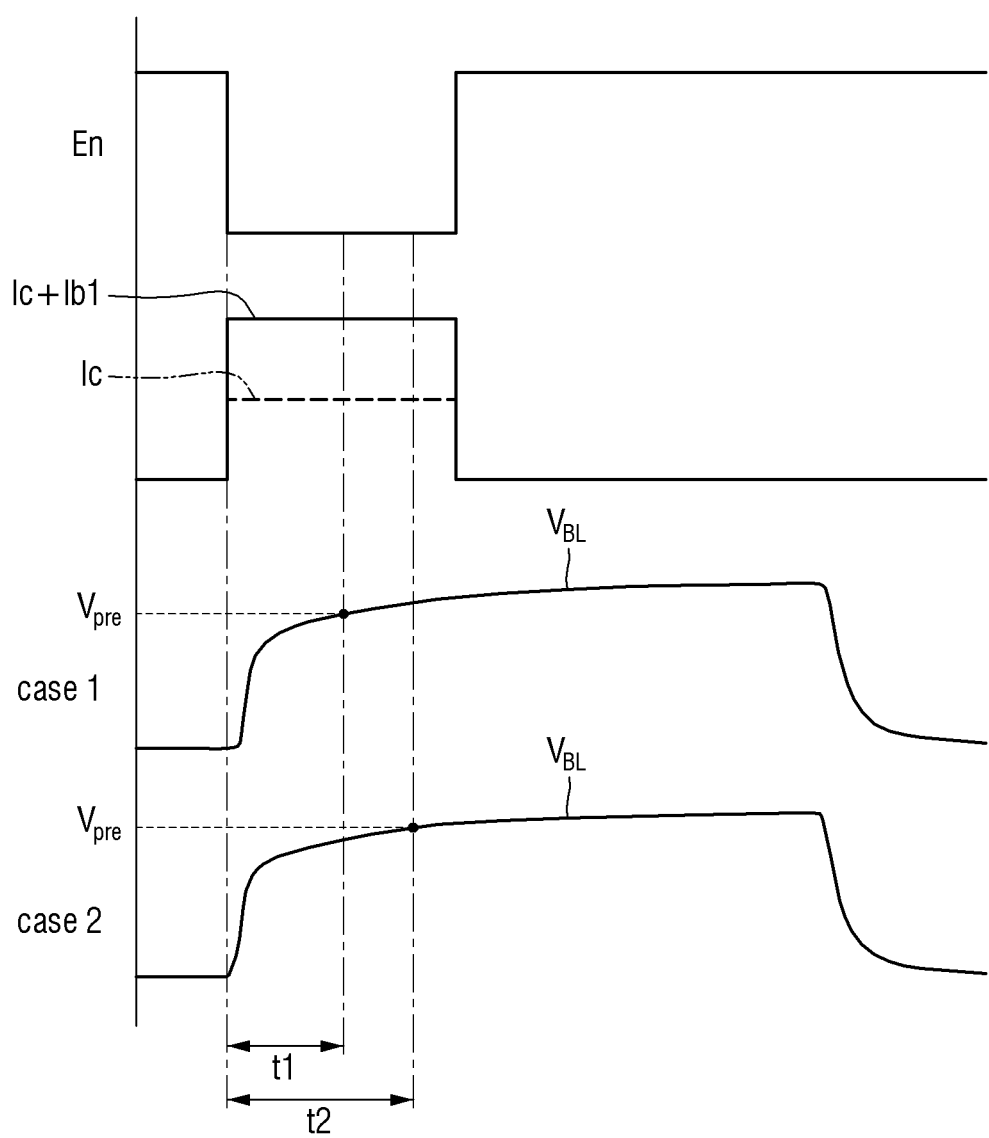
FIG. 6 is a diagram for explaining the operation and effect of the semiconductor memory device at a first operating temperature, according to example embodiments.

FIG. 6 is a diagram for explaining the operation and effect of the semiconductor memory device at the first operating temperature T1, according to example embodiments. For clarity, a redundant description of elements and features identical to those described above will be omitted.

Referring to FIGS. 4 and 6, the enable signal En may be transmitted to each of a gate of the first transistor TR1 and a gate of the third transistor TR3. In some embodiments, when each of the first transistor TR1 and the third transistor TR3 is a PMOS transistor, the first current I1 may be generated when the enable signal En is at a low level.

It will hereinafter be assumed that the control current generating circuit 110 and the control voltage generating circuit 120 generate an output current and an output voltage proportional to the temperature.

The first operating temperature T1 may be, for example, a temperature higher than room temperature. As described above, at the first operating temperature T1, the boost circuit 220 may be controlled by the first control voltage Vp1, and the first boost current Ib1 may be supplied to the first node node1. Therefore, at the first operating temperature T1, the first current I1 may be the sum of the precharge current Ic and the first boost current Ib1.

A first graph (case 1) is a graph illustrating a voltage of a bit line $V_{BL}$ when the first current I1 (i.e., the sum of the precharge current Ic and the first boost current Ib1) is provided to the bit line so as to precharge the bit line. A second graph (case 2) is a graph illustrating a voltage of a bit line $V_{BL}$ when the precharge current Ic is provided to the bit line so as to precharge the bit line.

Referring to the first graph (case 1), a first period of time t1 from the time when the enable signal En transits to a low level may be required to complete the precharging of a bit line. For example, after the first period of time t1 a voltage level of the bit line may reach a precharge level Vpre. Referring to the second graph (case 2), a second period of time t2 from the time when the enable signal En transits to a low level may be required to complete the precharging of a bit line. For example, after the second period of time t2 a voltage level of the bit line may reach the precharge level Vpre. The second period of time t2 may be greater than the first period of time t1.

For example, at the first operating temperature T1 higher than the room temperature, the precharge current Ic and the first boost current Ib1 may be included in the first current I1 for precharging a bit line. Therefore, the time period required to precharge a bit line can be reduced.

Figure 7:
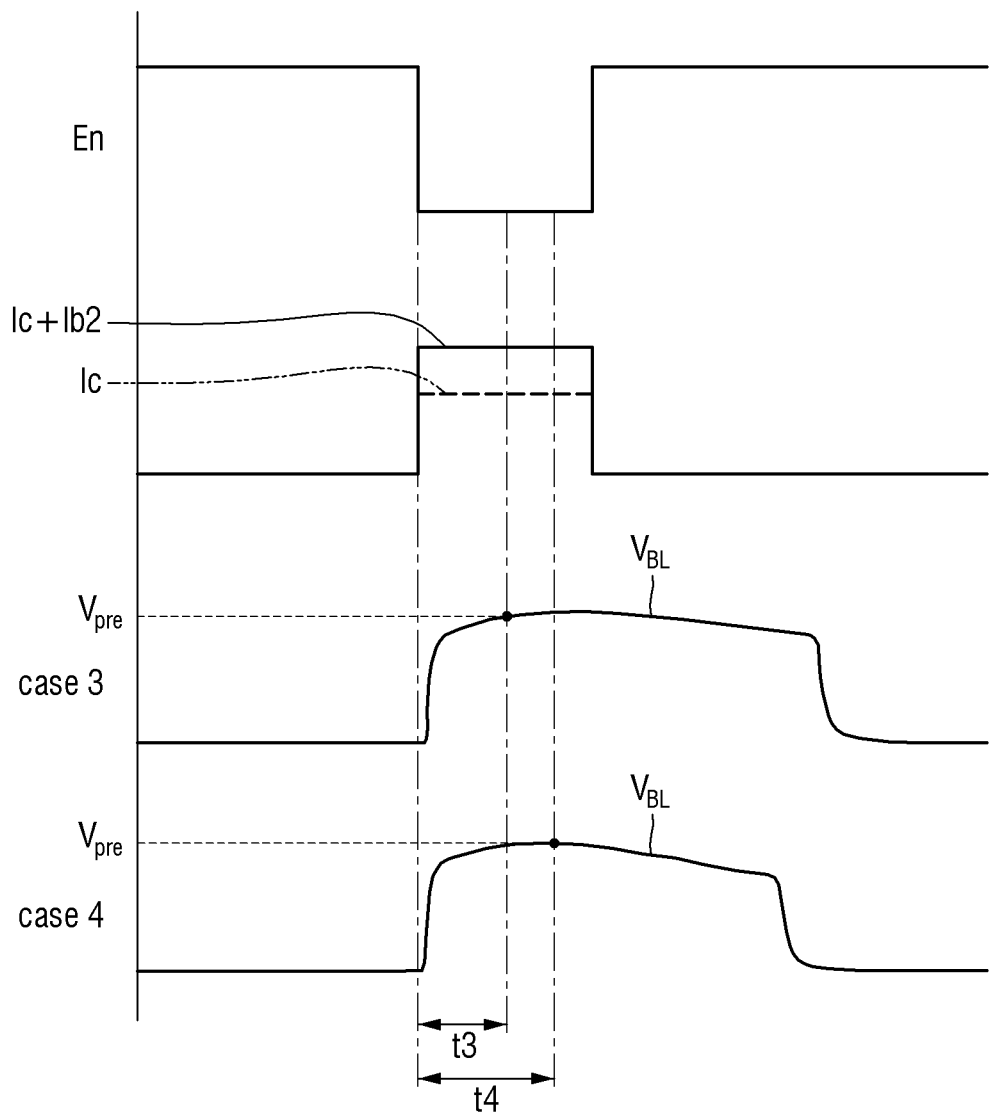
FIG. 7 is a diagram for explaining the operation and effect of the semiconductor memory device at a second operating temperature, according to example embodiments.

FIG. 7 is a diagram for explaining the operation and effect of the semiconductor memory device at the second operating temperature T2, according to example embodiments. For clarity, a redundant description of elements and features identical to those described above will be omitted. It will hereinafter be assumed that the control current generating circuit 110 and the control voltage generating circuit 120 generate an output current and an output voltage proportional to the temperature.

Referring to FIGS. 4 and 7, the second operating temperature T2 may be, for example, a temperature lower than the room temperature. As described above, at the second operating temperature T2, the boost circuit 220 may be controlled by the second control voltage Vp2, and the second boost current Ib2 may be provided to the first node node1. Therefore, at the second operating temperature T2, the first current I1 may be the sum of the precharge current Ic and the second boost current Ib2.

A third graph (case 3) is a graph illustrating a voltage of a bit line $V_{BL}$ when the first current I1 (i.e., the sum of the precharge current Ic and the second boost current Ib2) is provided to the bit line so as to precharge the bit line. A fourth graph (case 4) is a graph illustrating a voltage of a bit line $V_{BL}$ when the precharge current Ic is provided to the bit line so as to precharge the bit line.

Referring to the third graph (case 3), a third period of time t3 from the time when the enable signal En transits to a low level may be required to complete the precharging of a bit line. For example, after the third period of time t3 a voltage level of the bit line may reach the precharge level Vpre. Referring to the fourth graph (case 4), a fourth period of time t4 from the time when the enable signal En transits to a low level may be required to complete the precharging of a bit line. For example, after the fourth period of time t4 a voltage level of the bit line may reach the precharge level Vpre. The fourth period of time t4 may be greater than the third period of time t3.

For example, at the second operating temperature T2 lower than the room temperature, the precharge current Ic and the second boost current Ib2 may be included in the first current I1 for precharging a bit line. Therefore, the time period required to precharge a bit line can be reduced.

As can be seen by comparing FIGS. 6 and 7, the magnitude of the first boost current Ib1 may be greater than the magnitude of the second boost current Ib2. For example, the magnitude of the first current I1 at the first operating temperature T1 may be greater than the magnitude of the first current I1 at the second operating temperature T2. When a bit line is precharged using the precharge current Ic and the first control current Ip1 at the second operating temperature T2, there may be a high probability of over-precharge. The over-precharge may reduce the operating speed of the semiconductor memory device 10. To avoid the over-precharge, a bit line may be precharged using the precharge current Ic and the second boost current Ib2, which corresponds to the second control current Ip2, at the second operating temperature T2.

The semiconductor memory device 10 according to example embodiments allows the output current of the control current generating circuit 110 according to the operating temperature to flow through the second node node2 of the first sensing circuit 201. This cannot only reduce the time period required to precharge a bit line but also prevent the over-precharge.

Figure 8:
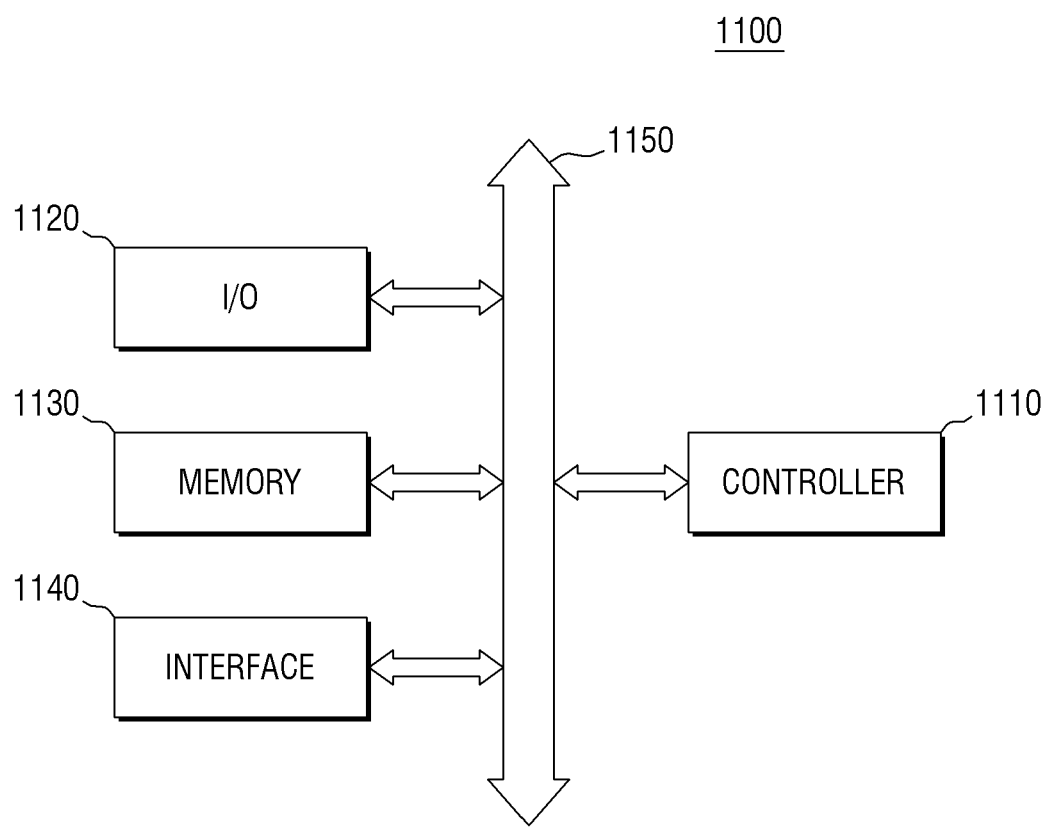
FIG. 8 is a block diagram of an electronic system including a semiconductor memory device according to certain embodiments.

FIG. 8 is a block diagram of an electronic system 1100 including a semiconductor memory device according to certain embodiments.

Referring to FIG. 8, the electronic system 1100 according to the embodiments may include a controller 1110, an input/output (I/O) device 1120, a memory device 1130, an interface 1140, and a bus 1150. The controller 1110, the I/O device 1120, the memory device 1130, and/or the interface 1140 may be coupled to each other through the bus 1150. The bus 1150 may correspond to a path through which data is moved.

The controller 1110 may include at least one of a microprocessor, a digital signal processor, a microcontroller and logic devices capable of performing similar functions to those of a microprocessor, a digital signal processor and a microcontroller. The I/O device 1120 may include a keypad, a keyboard, a display device, etc. The memory device 1130 may store data and communicate with the bus 1150 by data and/or commands. The interface 1140 may be used to transmit data to or receive data from a communication network. The interface 1140 may be a wired or wireless interface. In an example, the interface 1140 may include an antenna or a wired or wireless transceiver.

The electronic system 1100 may further include a high-speed dynamic random access memory (DRAM) and/or static random access memory (SRAM) as a working memory for improving the operation of the controller 1110.

In addition, the semiconductor memory device 10 according to the above-described embodiments may be provided in the memory device 1130 or may be provided as a part of the controller 1110, the I/O device 1120, etc.

The electronic system 1100 can be applied to a personal digital assistant (PDA), a portable computer, a web tablet, a wireless phone, a mobile phone, a digital music player, a memory card, or any electronic device capable of transmitting and/or receiving information in a wireless environment.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor memory device comprising:
   a memory cell array including a plurality of memory cells connected to a plurality of bit lines;
   a control signal generating circuit configured to generate a first control signal in response to a first operating temperature of the semiconductor memory device and a second control signal in response to a second operating temperature of the semiconductor memory device;
   a precharge circuit configured to provide a precharge current to a first bit line of the plurality of bit lines in response to an enable signal; and a boost circuit configured to provide a boost current to the first bit line in response to the enable signal, wherein magnitude of the boost current is responsive to one of the first and second control signals.

2. The semiconductor memory device of claim 1,
wherein the control signal generating circuit is configured to generate a first control voltage as the first control signal in response to a first control current at the first operating temperature and to generate a second control voltage as the second control signal in response to a second control current at the second operating temperature,
wherein the precharge circuit comprises a first transistor and a second transistor connected in series between a voltage source and a first node electrically connected to the first bit line and is configured to provide the precharge current to the first node,
wherein the boost circuit comprises a third transistor, a fourth transistor and a fifth transistor connected in series between the voltage source and the first node,
wherein at least one of the third transistor, the fourth transistor and the fifth transistor is gated by any one of the first control voltage and the second control voltage,
wherein the boost circuit is configured to provide a first boost current having the same magnitude as the first control current to the first node when at least one of the third transistor, the fourth transistor and the fifth transistor is gated by the first control voltage, and provide a second boost current having the same magnitude as the second control current to the first node when at least one of the third transistor, the fourth transistor and the fifth transistor is gated by the second control voltage,
wherein the precharge circuit and the boost circuit are configured to precharge the first bit line by using the precharge current and the first boost current at the first operating temperature, respectively, and
wherein the precharge circuit and the boost circuit are configured to precharge the first bit line by using the precharge current and the second boost current at the second operating temperature, respectively.

3. The semiconductor memory device of claim 2, wherein the fourth transistor among the third transistor, the fourth transistor and the fifth transistor is gated by any one of the first control voltage and the second control voltage.

4. The semiconductor memory device of claim 3, wherein:
a terminal of the third transistor is connected to the voltage source,
a terminal of the fourth transistor is connected to the other terminal of the third transistor, and
a terminal of the fifth transistor is connected to the other terminal of the fourth transistor, and the other terminal of the fifth transistor is connected to the first node.

5. The semiconductor memory device of claim 3, wherein the first boost current passes through the fourth transistor when the fourth transistor is gated by the first control voltage, and the second boost current passes through the fourth transistor when the fourth transistor is gated by the second control voltage.

6. The semiconductor memory device of claim 2, wherein the first transistor is gated by the enable signal and has a terminal connected to the voltage source, and the second transistor has a terminal connected to the other terminal of the first transistor and the other terminal of the second transistor connected to the first node.

7. The semiconductor memory device of claim 6, wherein the third transistor is gated by the enable signal.

8. The semiconductor memory device of claim 2, wherein the first operating temperature is higher than the second operating temperature, and the magnitude of the first control current is greater than that of the second control current.

9. The semiconductor memory device of claim 2, wherein a gate of the second transistor is connected to a gate of the fifth transistor.

10. A semiconductor memory device comprising:
a memory cell array including a plurality of memory cells connected to a plurality of bit lines;
a control signal generating circuit configured to generate a first control signal having a value responsive to a first operating temperature and to generate a second control signal having a value responsive to a second operating temperature; and
a boost circuit connected to a voltage source and configured to be controlled by any one of the first control signal and the second control signal,
wherein the control signal generating circuit is configured to generate a first control current in response to the first operating temperature and to generate a second control current in response to the second operating temperature, and
wherein the boost circuit is configured to provide a first boost current having the same magnitude as the first control current to a first bit line of the plurality of bit lines when the boost circuit is controlled by the first control signal and provide a second boost current having the same magnitude as the second control current to the first bit line when the boost circuit is controlled by the second control signal.

11. The semiconductor memory device of claim 10, further comprising:
a precharge circuit connected to the voltage source and configured to provide a precharge current to the first bit line,
wherein the precharge circuit and the boost circuit are configured to:
precharge the first bit line by providing the precharge current and the first boost current at the first operating temperature, and
precharge the first bit line by providing the precharge current and the second boost current at the second operating temperature.

12. The semiconductor memory device of claim 10, wherein the first operating temperature is higher than the second operating temperature, and the magnitude of the first control current is greater than that of the second control current.

13. The semiconductor memory device of claim 10,
wherein the boost circuit comprises a first transistor, a second transistor and a third transistor connected in series between the voltage source and a first node electrically connected to the first bit line, and
wherein at least one of the first transistor, the second transistor and the third transistor is gated by any one of the first control signal and the second control signal.

14. The semiconductor memory device of claim 13, wherein the second transistor among the first transistor, the second transistor and the third transistor is gated by any one of the first control signal and the second control signal.

15. The semiconductor memory device of claim 10, further comprising:
a sensing transistor connected to the voltage source and configured to provide a sensing current to the first bit line in response to any one of the first control signal and the second control signal.

16. A semiconductor memory device comprising:
a memory cell array including a plurality of memory cells connected to a plurality of bit lines;
a control signal generating circuit configured to generate a first control signal in response to a first operating temperature of the semiconductor memory device and a second control signal in response to a second operating temperature of the semiconductor memory device; and
a sensing circuit configured to generate a precharge current in response to an enable signal, to generate a boost current in response to the enable signal and one of the first and second control signals, and to provide the precharge current and the boost current to a first bit line of the plurality of bit lines.

17. The semiconductor memory device of claim 16, wherein the sensing circuit comprises:
a precharge circuit connected to a voltage source and configured to provide the precharge current to a first node; and
a boost circuit connected to the voltage source and configured to provide the boost current to the first node, wherein the first node is connected to the first bit line.

18. The semiconductor memory device of claim 17, wherein the boost circuit comprises a first transistor, a second transistor and a third transistor connected in series between the voltage source and the first node, and
wherein at least one of the first transistor, the second transistor and the third transistor is gated by one of the first and second control signals.

19. The semiconductor memory device of claim 18, wherein the second transistor among the first transistor, the second transistor and the third transistor is gated by one of the first and second control signals.

20. The semiconductor memory device of claim 19, wherein the third transistor is gated by a bias voltage generated from a bias circuit.

* * * * *